United States Patent
Jain et al.

(10) Patent No.: US 12,386,379 B2
(45) Date of Patent: Aug. 12, 2025

(54) NON-VOLATILE CURRENT MIRROR CIRCUIT WITH PROGRAMMABLE TRANSISTOR

(71) Applicant: GlobalFoundries U.S. Inc., Malta, NY (US)

(72) Inventors: Navneet K. Jain, Milpitas, CA (US); Venkatesh P. Gopinath, Fremont, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 248 days.

(21) Appl. No.: 18/155,983

(22) Filed: Jan. 18, 2023

(65) Prior Publication Data
US 2024/0241534 A1    Jul. 18, 2024

(51) Int. Cl.
G05F 3/26        (2006.01)
(52) U.S. Cl.
CPC .................................. G05F 3/262 (2013.01)
(58) Field of Classification Search
CPC ................................ G05F 3/26; G05F 3/262
See application file for complete search history.

(56) References Cited

U.S. PATENT DOCUMENTS

| | | | |
|---|---|---|---|
| 4,544,878 A * | 10/1985 | Beale | G05F 3/262 323/315 |
| 6,462,527 B1 | 10/2002 | Maneatis | |
| 8,405,377 B2 | 3/2013 | Yu et al. | |
| 11,855,642 B1 | 12/2023 | Jain et al. | |
| 2010/0052646 A1* | 3/2010 | Shiah | G05F 1/561 323/315 |
| 2011/0187344 A1* | 8/2011 | Iacob | G05F 3/16 323/315 |
| 2017/0308112 A1* | 10/2017 | Reichelt | G05F 3/26 |
| 2021/0263547 A1* | 8/2021 | Shen | G05F 3/262 |

FOREIGN PATENT DOCUMENTS

CN        101860368 A        10/2010

OTHER PUBLICATIONS

Yan et al., "Simulation of FeFET-Based Basic Logic Circuits and Current Sensing Amplifier,," Integrated Ferroelectrics: An International Journal, published online on Dec. 21, 2015, 167:1, 52-61, DOI: 10.1080/10584587.2015.1105703.

Jackson et al., "A Programmable Current Mirror for Analog Trimming Using Single-Poly Floating-Gate Devices in Standard CMOS Technology," IEEE Transactions on Circuits and Systems—II: Analog and Digital Signal Processing, vol. 48, No. 1, Jan. 2001, 3 pages.

* cited by examiner

Primary Examiner — Alex Torres-Rivera
(74) Attorney, Agent, or Firm — David Cain; Hoffman Warnick LLC (57) ABSTRACT

Embodiments of the present disclosure provide a structure, including: a current mirror; a programmable transistor with an adjustable threshold voltage connected in parallel with an output transistor of the current mirror; an enable switch for coupling the current mirror to a gate of the programmable transistor; and a programming switch coupled to the gate of the programmable transistor.

17 Claims, 11 Drawing Sheets

| VLS | En1 | En1b | En2 | En2b | Vg | n | Enab. Switch | Prog. Switch | Mode |
|---|---|---|---|---|---|---|---|---|---|
| 0 | 0 | VDD | VDD | 0 | <VDD | 0 | OFF | ON | Off |
| 0 | VDD | 0 | 0 | VDD | <VDD | Vg | ON | OFF | Current Mirror |
| VP | 0 | VP | VP | 0 | <VDD | VP | OFF | ON | Program |
| -Ve | -Ve-VTH | VDD | 0 | -Ve | <VDD | -Ve | OFF | ON | Erase |

NON-VOLATILE CURRENT MIRROR CIRCUIT WITH PROGRAMMABLE TRANSISTOR

BACKGROUND

Embodiments of the disclosure relate generally to current mirrors. More specifically, the disclosure provides a non-volatile current mirror circuit with a programmable transistor.

Current mirrors are often used in analog circuits to generate an output current proportional to an input current. The proportionality constant of the input and output currents in a current mirror is commonly known as the mirroring ratio and is dependent, for example, on the size ratio of the input and output transistors used. Generally, a current mirror 10 can be realized using a pair of field effect transistors (FETs) as depicted in FIG. 1.

Figure 1:
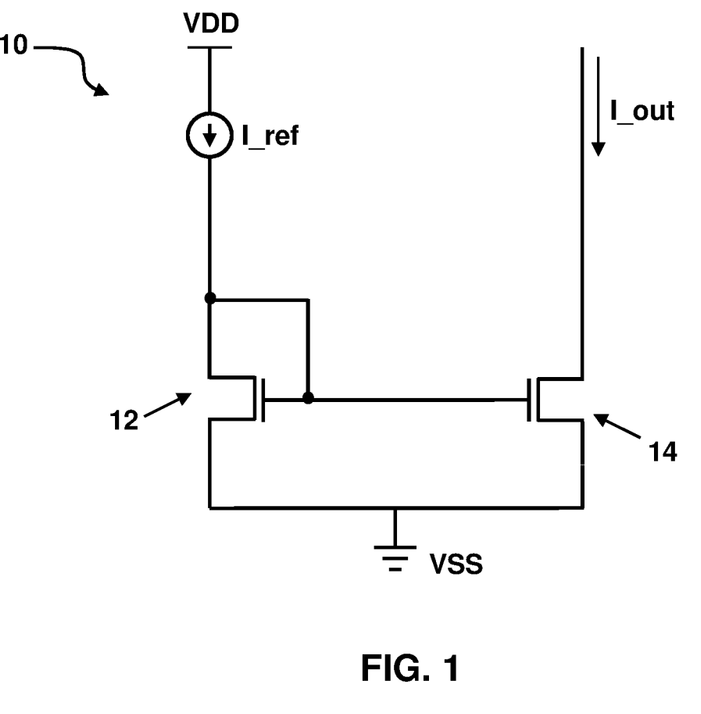
FIG. 1 depicts a conventional current mirror.

As shown in FIG. 1, the current mirror 10 includes an N-type reference FET 12, which has its drain and gate coupled together, and an N-type output FET 14, which has its gate coupled to the gate of the FET 12. When a reference current I_ref flows through the FET 12, the voltage at the gate of the FET 12 controls the output current I_out flowing through the output FET 14. As a result, the reference current I_ref is mirrored (or proportionally mirrored) by the output current I_out.

The size ratio of the FETs 12, 14, and hence the mirroring ratio, of the current mirror 10 may be altered by connecting a plurality of the output FETs 14 in parallel. By adding switches controlled, for example, by externally stored binary control bits, in series with the parallel-connected output FETs 14, the number of output FETs 14 active in the current mirror 10 at any given moment can be changed by controlling the switches, and in this manner the mirroring ratio can be dynamically controlled (e.g., programmed).

SUMMARY

Aspects of the disclosure provide a structure, including: a current mirror; a programmable transistor with an adjustable threshold voltage connected in parallel with an output transistor of the current mirror; an enable switch for coupling the current mirror to a gate of the programmable transistor; and a programming switch coupled to the gate of the programmable transistor.

Another aspect of the disclosure includes a current mirror circuit, including: a current mirror; a programmable transistor with an adjustable threshold voltage connected in parallel with an output transistor of the current mirror, wherein the programmable transistor is operable in any of an off mode, a current mirror mode, a programming mode, and an erase mode; an enable switch for coupling the current mirror to a gate of the programmable transistor; and a programming switch coupled to the gate of the programmable transistor for controlling the adjustable threshold voltage of the programmable transistor.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Figure 2:
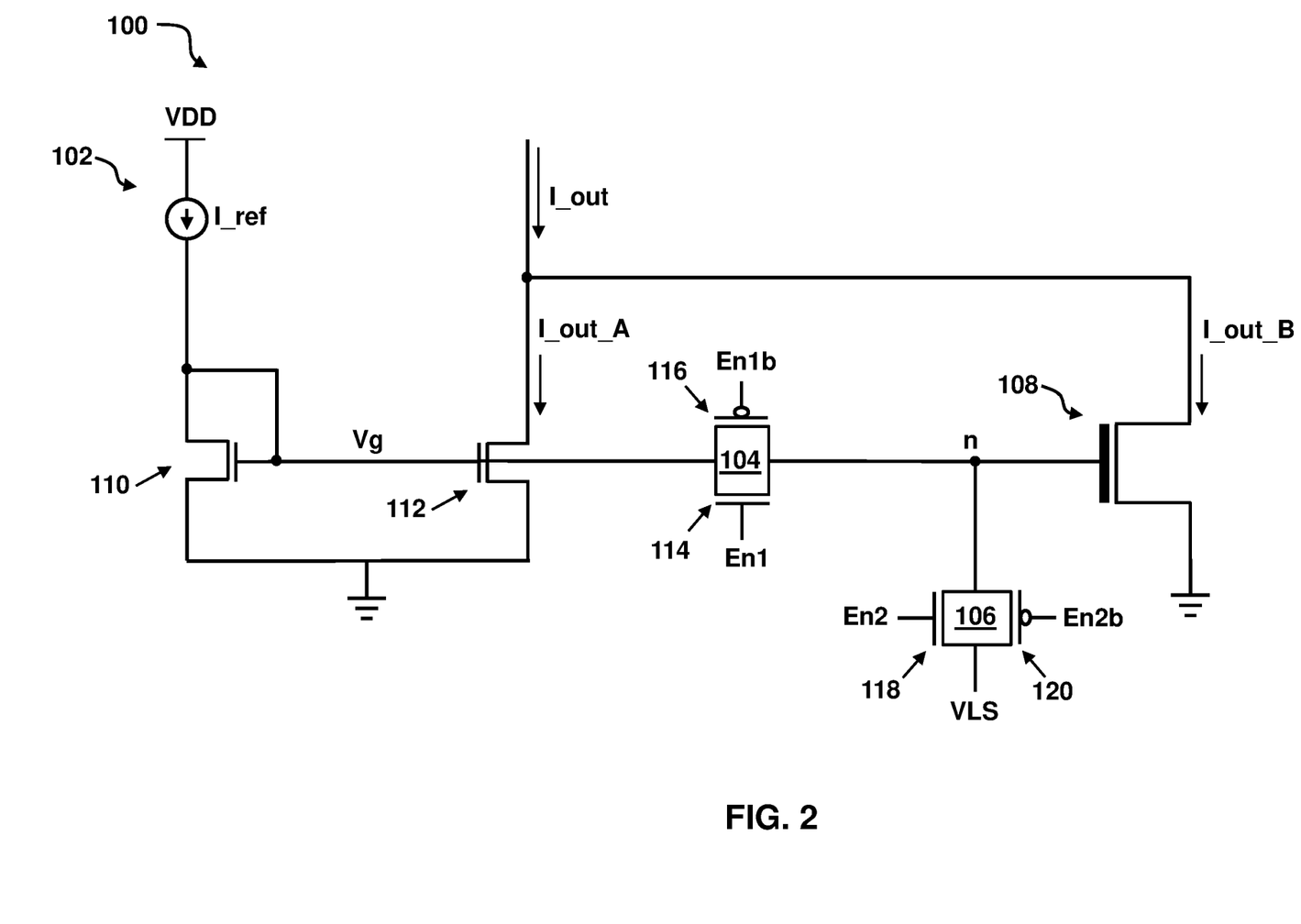
FIG. 2 depicts a current mirror circuit with a programmable transistor according to embodiments of the disclosure.

FIG. 2 depicts a non-volatile programmable current mirror circuit 100 according to embodiments of the disclosure. In general, the current mirror circuit 100 includes a current mirror 102, an enable switch 104, a programming switch 106, and a programmable transistor 108 with a threshold voltage (VT) that is programmable (e.g., either low or high) in order to selectively adjust the total output current I_out of the current mirror circuit 100 and to do so without relying on externally stored binary control bits.

Similar to the current mirror 10 depicted in FIG. 1, the current mirror 102 in FIG. 2 includes an N-type reference field effect transistor (FET) 110 and an N-type output FET 112. As shown, the drain and the gate of the FET 110 are tied together. The gate of the FET 110 is also connected to the gate of the output FET 112. Ignoring for the moment the effect of the programmable transistor 108 on the output current I_out, when a reference current I_ref flows through the FET 110, the voltage Vg at the gate of the FET 110 controls the output current I_out flowing through the output FET 112. To this extent, the reference current I_ref is mirrored (or proportionally mirrored) by the output current I_out.

The enable switch 104 can be a complementary metal oxide semiconductor (CMOS)-based switch (also referred to herein as a transmission gate). Such a CMOS-based switch can include an N-type FET (NFET) 114 coupled in parallel to a P-type FET (PFET) 116, with the drain and source of the NFET 114 tied to the drain and source, respectively, of the PFET 116. A first enable signal En1 is provided to the gate of the NFET 114 and an inverse of the first enable signal En1b is provided to the gate of the PFET 116. In general, when the first enable signal En1 is high and the inverse of the first enable signal En1b is low, the enable switch 104 is "ON" and the voltage Vg at the input of the enable switch 104 is passed to an output (node n) of the enable switch 104. When the first enable signal En1 is low and the inverse of the first enable signal En1b is high, the enable switch 104 is "OFF" and the voltage Vg at the input of the enable switch 104 is not passed to node n. Alternatively, the enable switch 104 could be any other type of switch suitable for selectively passing Vg to node n when "ON" or preventing passage of Vg to node n when "OFF". As shown in FIG. 2, node n is coupled to the gate of the programmable transistor 108.

Similar to the enable switch 104, the programming switch 106 can also be a CMOS-based switch. That is, it can include an NFET 118 coupled in parallel to a PFET 120, with the drain and source of the NFET 118 tied to the drain and source, respectively, of the PFET 120. A second enable signal En2 is provided to the gate of the NFET 118 and an inverse of the second enable signal En2b is provided to the gate of the PFET 120. In operation, when the second enable signal En2 is high and the inverse of the second enable signal En2b is low, the programming switch 106 is "ON" and the voltage VLS at the input of the programming switch 106 is passed to the output (node n) of the programing switch 106. When the second enable signal En2 is low and the inverse of the second enable signal En2b is high, the programming switch 106 is "OFF" and the voltage VLS at the input of the programming switch 106 is not passed to node n. Alternatively, the programming switch 106 could be any other type of switch suitable for selectively passing VLS to node n when "ON" or preventing passage of VLS to node n when "OFF".

As described above, the programmable transistor 108 has a threshold voltage (VT) that is programmable (e.g., either low or high) in order to selectively adjust the total output current I_out of the current mirror circuit 100. As shown in FIG. 2, the programmable transistor 108 is coupled in parallel with the output FET 112 of the current mirror 102, with the drain of the programmable transistor 108 connected to the drain of the output FET 112 and the source of the programmable transistor 108 and the source of the output FET 112 tied to ground (VSS). To this extent, the total current I_out produced by the current mirror circuit 100 is equal to the sum of the current flowing through the output FET 112 of the current mirror 102 (I_out_A) and the current (if any) flowing through the programmable transistor 108 (I_out_B).

According to embodiments of the disclosure, the VT of the programmable transistor 108 may be programmed so that it is either low or high. In general, when the VT of the programmable transistor 108 is low, then, during the operation of the current mirror circuit 100, the total current I_out produced by the current mirror circuit 100 is equal to the sum of the current flowing through the output FET 112 of the current mirror 102 (I_out_A) and the current flowing through the programmable transistor 108 (I_out_B). When the VT of the programmable transistor 108 is high, the programmable transistor 108 is off and the total current I_out produced by the current mirror circuit 100 is equal to the current flowing through the output FET 112 of the current mirror 102 (I_out_A).

According to embodiments of the disclosure, the programmable transistor 108 can be, for example, an NFET (as illustrated) or a PFET configured for electric field-induced VT switching (as opposed to current-induced VT switching) between a first VT (e.g., a low VT) and a second VT (e.g., a high VT) that is different from the first VT and, particularly, that is higher than the first VT. For example, if the programmable transistor 108 is an NFET configured for electric field-induced VT switching, then the VT of the NFET can be programmable to a relatively low VT, such as a VT of 0V or some other low VT, or to a relatively high VT, such as a VT of 1.5V or some VT that is higher than the low VT. FETs that are configured for electric field-induced VT switching and that could be incorporated into the current mirror circuit 100 include, but are not limited to, ferroelectric field effect transistors (FeFETs) and charge trap field effect transistors (CTFETs).

Figure 3A:
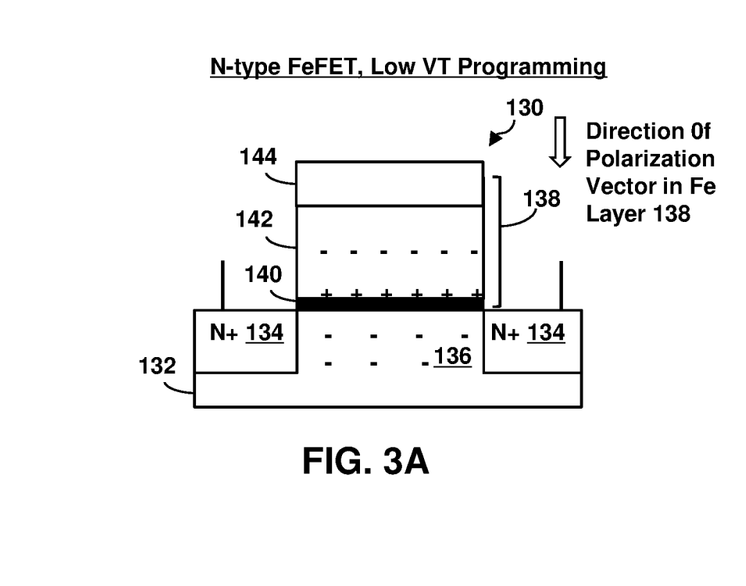
FIGS. 3A and 3B are cross-sectional diagrams illustrating different threshold voltage (VT) states of an N-type ferroelectric field effect transistor (FeFET) that can be incorporated into the current mirror circuit of FIG. 2 as a programmable transistor according to embodiments of the disclosure.
Figure 3B:
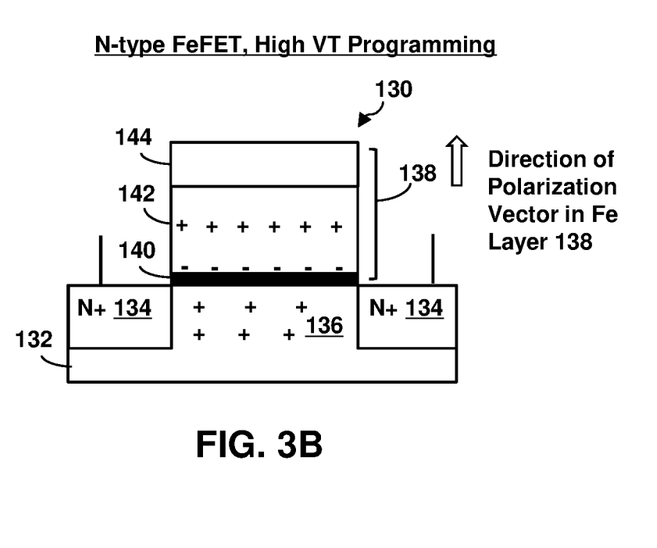

FIGS. 3A and 3B are cross-section diagrams illustrating different VT states of an N-type FeFET 130 that can be incorporated into the current mirror circuit 100 as a programmable transistor 108 according to embodiments of the disclosure. The FeFET 130 can include a semiconductor layer 132 (e.g., a silicon layer or a layer of some other suitable semiconductor material) and, within and/or on the semiconductor layer 132, N+ source/drain terminals 134 and a channel region 136 (e.g., an intrinsic or P– channel region, depending upon the process technology at issue) positioned between the N+ source/drain terminals 132. The FeFET 130 can further include a gate terminal 138 adjacent to the channel region 136. The gate terminal 138 can be a multi-layered structure including, for example, a gate dielectric layer 140 on the channel region 134, a ferroelectric layer 142 (e.g., a hafnium oxide layer or some other suitable ferroelectric layer) on the gate dielectric layer 140, and a control gate layer 144 (e.g., a metal gate layer) on the ferroelectric layer 142. With such a gate terminal 138, the FeFET 130 has an electric field-based programmable VT and, particularly, has a VT that can be set at a first VT (i.e., a low VT, such as a VT of 0V) or a second VT that is higher than the first VT (i.e., a high VT, such as a VT of 1.5V) depending upon the bias conditions on the gate terminal 138 and at least one of the source/drain terminals 134. Those skilled in the art will recognize that setting the VT at the first VT is a process often referred to as a writing or programming process, whereas setting the VT at the second VT that is higher than the first VT is often referred to as an erasing process.

To achieve electric field-induced switching to the first VT, the FeFET 130 can be operated in a first programming mode (also referred to herein as a low VT programming mode), during which a programming voltage (VP) that is, for example, within the range of approximately 2.5V to approximately 3.0V can be applied to the gate terminal 138 and a ground voltage (GND) of, for example, 0V can be applied to at least one of the N+ source/drain terminals 134. This results in the direction of polarization vector of the ferroelectric layer 142 pointing toward the channel region 136 (i.e., it results in +poles of dipoles in the ferroelectric layer 142 being adjacent to the channel region 136 and –poles of the dipoles being adjacent to the control gate layer 144) such that electrons are attracted to the channel region 136, thereby setting the VT at the first VT (see FIG. 3A). When the first VT is set, the channel region 136 between the N+ source/drain terminals 134 will become conductive in response to a voltage subsequently applied to the gate terminal 138 and set between the first VT and the second VT (and significantly lower than VP).

To achieve electric field-induced switching to the second VT, the FeFET 130 can be operated in a second programming mode (also referred to herein as a high VT programming mode or an erase mode). In the second programming mode, a negative erase voltage Ve can be applied to the gate terminal 138 and GND can be applied to at least one of the N+ source/drain terminals 136. Alternatively, GND can be applied to the gate terminal 138 and Ve that is, for example, within the range of approximately 2.5V to approximately 3.0V can be applied to at least one of the N+ source/drain terminals 136. Either way, this results in the direction of polarization vector of the ferroelectric layer 142 pointing toward the control gate layer 144 (i.e., it results in +poles of dipoles in the ferroelectric layer 142 being adjacent to the control gate layer 144 and −poles of the dipoles being adjacent to the channel region 136) such that electrons are repelled from the channel region 136, thereby setting the VT to the second VT (see FIG. 3B). When the second VT is set, the channel region 136 will remain non-conductive in response to the same gate voltage (as mentioned above) subsequently applied to the gate terminal 138.

Figure 4A:
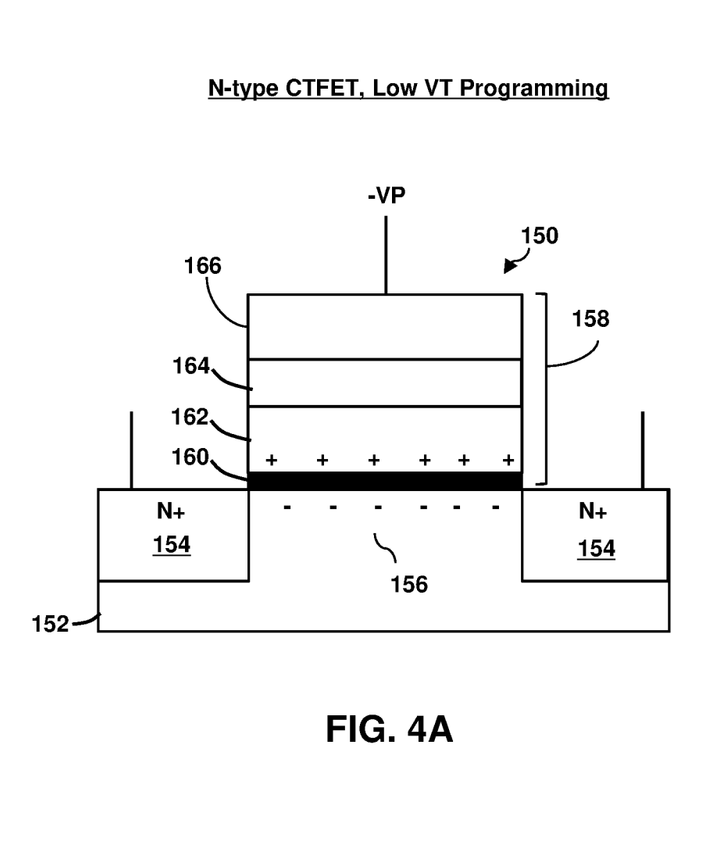
FIGS. 4A and 4B are cross-sectional diagrams illustrating different VT states of an N-type charge trap field effect transistor (CTFET) that can be incorporated into the current mirror circuit of FIG. 2 as a programmable transistor according to embodiments of the disclosure.
Figure 4B:
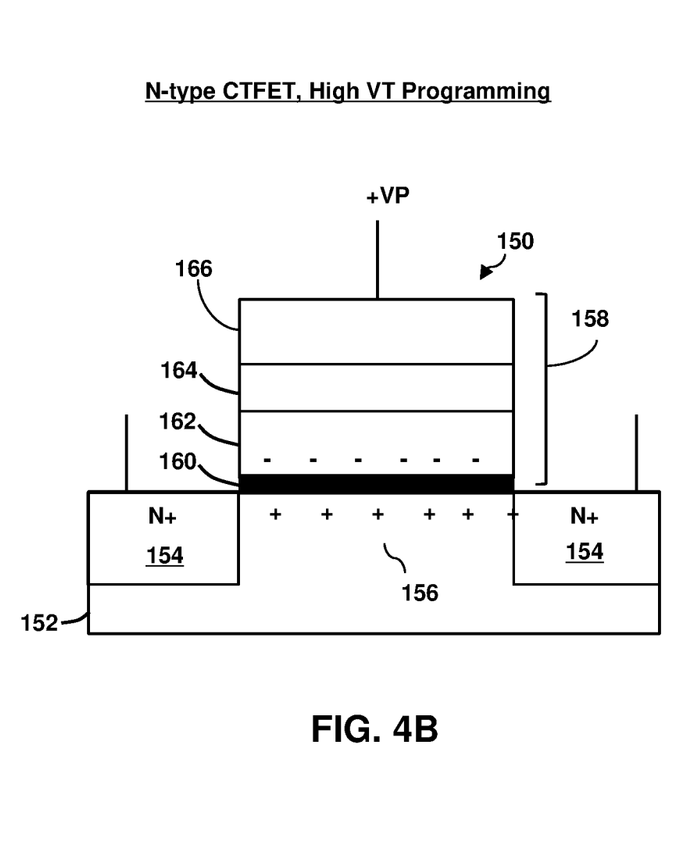

FIGS. 4A and 4B are cross-section diagrams illustrating different VT states of an N-type CTFET 150 that could, alternatively, be incorporated into the current mirror circuit 100 as a programmable transistor 108. The N-type CTFET 150 can include a semiconductor layer 152 (e.g., a silicon layer or a layer of some other suitable semiconductor material) and, within and/or on the semiconductor layer 152, N+ source/drain terminals 154 and a channel region 156 (e.g., an intrinsic or P− channel region, depending upon the process technology at issue) positioned between the N+ source/drain terminals 154. The N-type CTFET 150 can further include a gate terminal 158 adjacent to the channel region 156. The gate terminal 158 can be a multi-layered structure including, for example, a gate dielectric layer 160 on the channel region 156, a charge trap layer 162 (e.g., a silicon nitride layer or some other suitable charge trap layer) on the gate dielectric layer 160, another gate dielectric layer 164 on the charge trap layer 162 and a control gate layer 166 (e.g., a metal gate layer) on the gate dielectric layer 164. With such a gate terminal 158, the N-type CTFET 150 has an electric field-based programmable VT and, particularly, a VT that can be set at a first VT (i.e., a low VT, such as a VT of 0V) or a second VT that is higher than the first VT (i.e., a high VT, such as a VT of 1.5V) depending upon the bias conditions on the gate and source/drain terminals.

To achieve electric field-induced switching to the first VT, the N-type CTFET 150 can be operated in a first program mode (also referred to as a low VT program mode). In the first program mode, a negative voltage (−VP) can be applied to the gate terminal 158 and VP can be applied to at least one of the N+ source/drain terminals 154. This results in electrons moving out of the charge trap layer 162, thereby setting the VT at the first VT (see FIG. 4A). When the first VT is set, the channel region 156 between the N+ source/drain terminals 154 becomes conductive in response to a voltage subsequently applied to the gate terminal 154 and set between the first VT and the second VT.

To achieve electric field-induced switching to the second VT, the N-type CTFET 150 can be operated in a second program mode (also referred to as a high VT program mode or an erase mode). In the second program mode, Ve can be applied to the gate terminal 158 and a negative voltage (−Ve) can be applied to at least one of the N+ source/drain terminals 154. This results in electrons moving into and being trapped by the charge trap layer 162, thereby setting the VT up at the second VT (see FIG. 4B). When the second VT is set, the channel region 156 between the N+ source/drain terminals 154 will remain non-conductive in response to the same voltage subsequently applied to the gate terminal 158. It should be noted that the absolute value of Ve can be the same as the absolute value VP or at a different level, but in any case, the voltage should be significantly lower than VP and Ve to avoid unintended VT switching.

Figure 5:
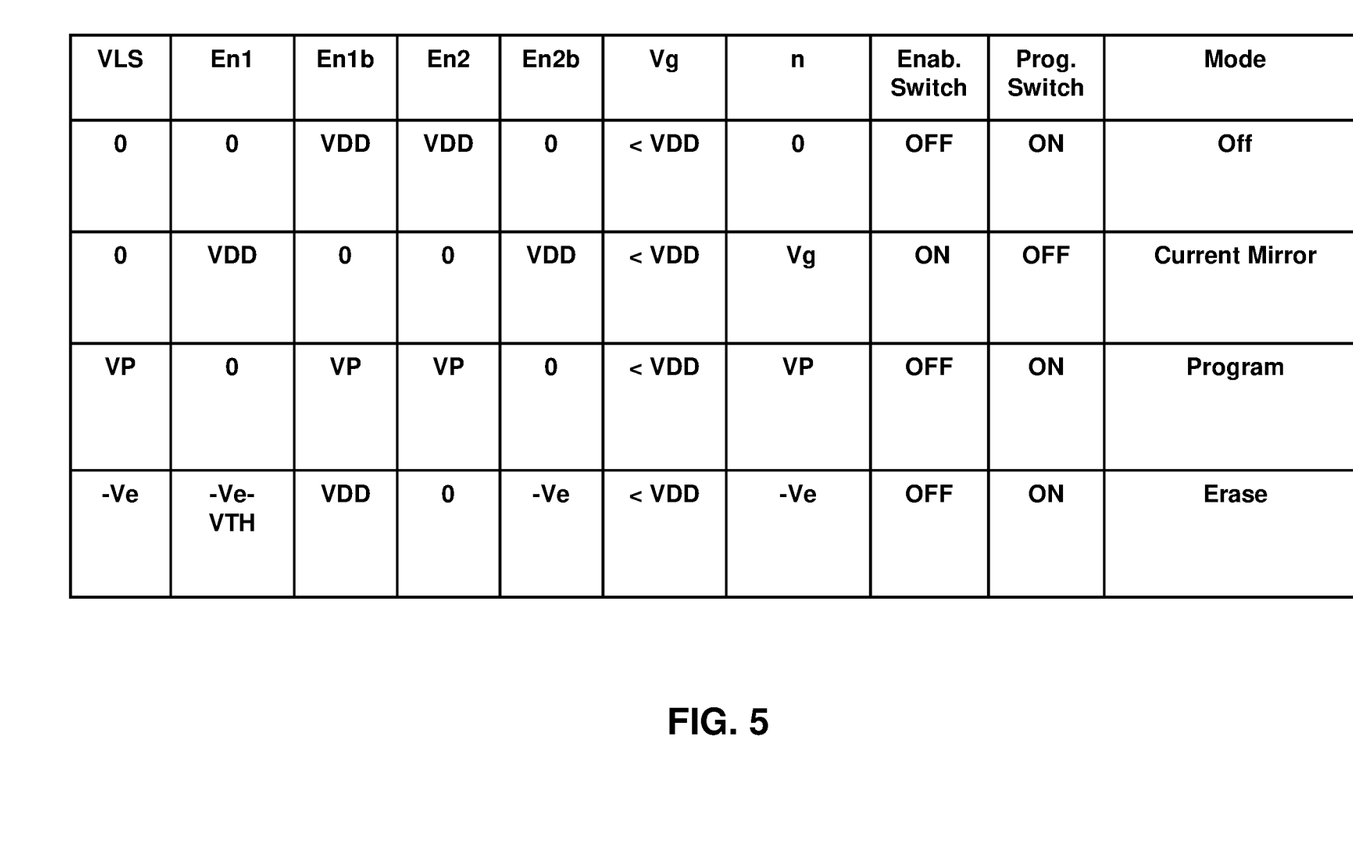
FIG. 5 is a table illustrating signals for controlling the operation of the current mirror circuit of FIG. 2 according to embodiments of the disclosure.

FIG. 5 is a table illustrating signals for controlling the operation of the current mirror circuit 100 of FIG. 2 with the programable FET 108 implemented using a FeFET-type programmable transistor according to embodiments of the disclosure. As shown in the table, the programmable transistor 108 in the current mirror circuit 100 may be operated in a plurality of different modes including an off mode, a current mirror mode, a programming mode, and an erase mode.

Figure 6:
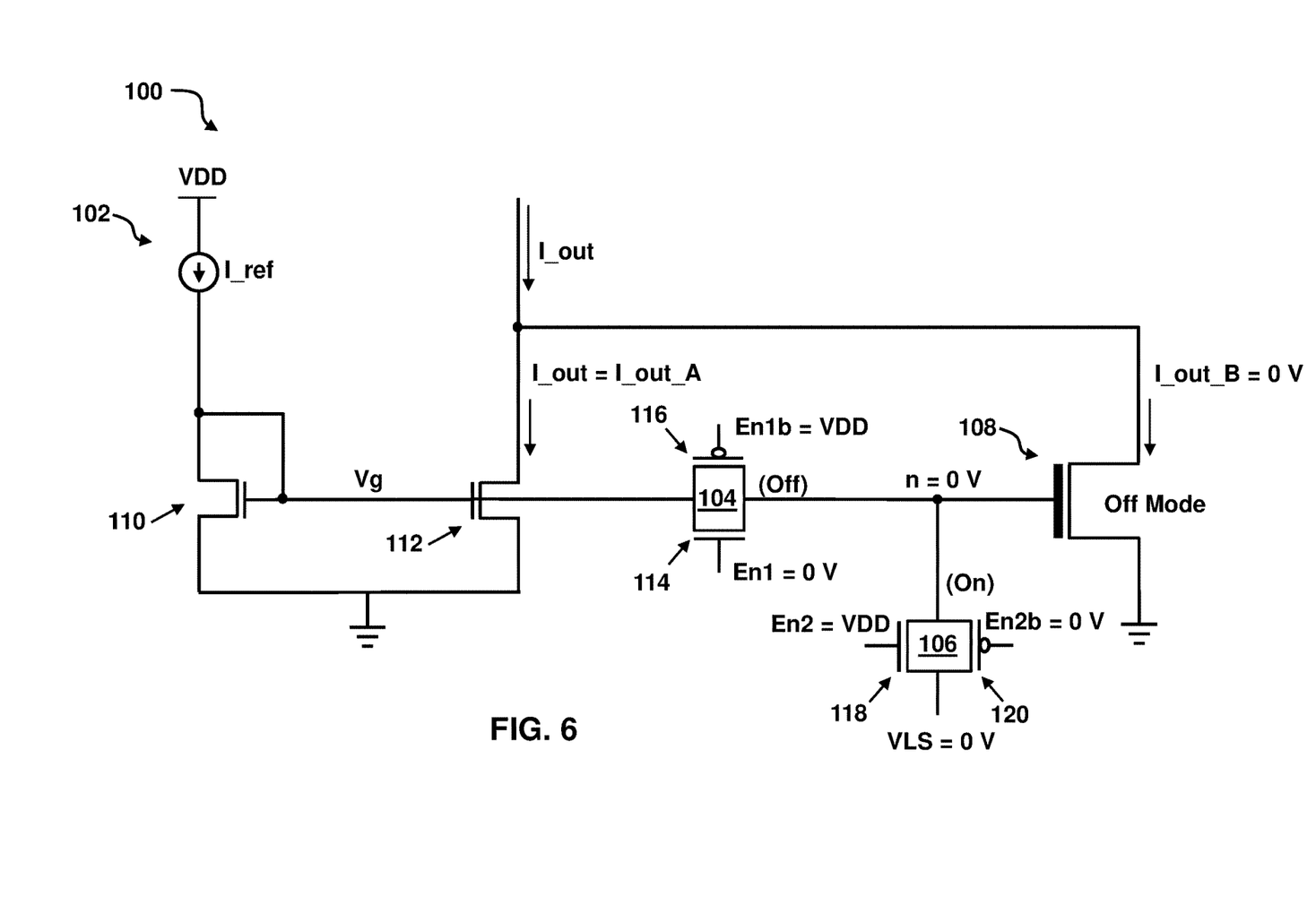
FIG. 6 depicts the current mirror circuit of FIG. 2 with the programmable transistor in an off mode according to embodiments of the disclosure.

The current mirror circuit 100 with the programmable transistor 108 in the off mode is depicted in FIG. 6. When the programmable transistor 108 is in the off mode, the programmable transistor 108 is disabled and does not provide any current to the current mirror circuit 100 (I_out_B=0). The programmable transistor 108 may be placed in the off mode by turning off the enable switch 104 and turning on the programming switch 106. The enable switch 104 may be turned off by applying a voltage of En1=0 V to the gate of the NFET 114 and applying a voltage of En1b=VDD to the gate of the PFET 116. The programming switch 106 may be turned on by applying a voltage En2=VDD to the gate of the NFET 118 and applying a voltage En2b=0 V to the gate of the PFET 120. With the programming switch 106 turned on, a voltage VLS=0 V is passed from an input of the programmable switch 106 to node n and is applied to the gate of the programmable transistor 108. This turns off the programmable transistor 108 (I_out_B=0 V) such that the output current I_out of the current mirror circuit 100 is equal to the output current of the current mirror 102 (I_out=I_out_A).

Figure 7:
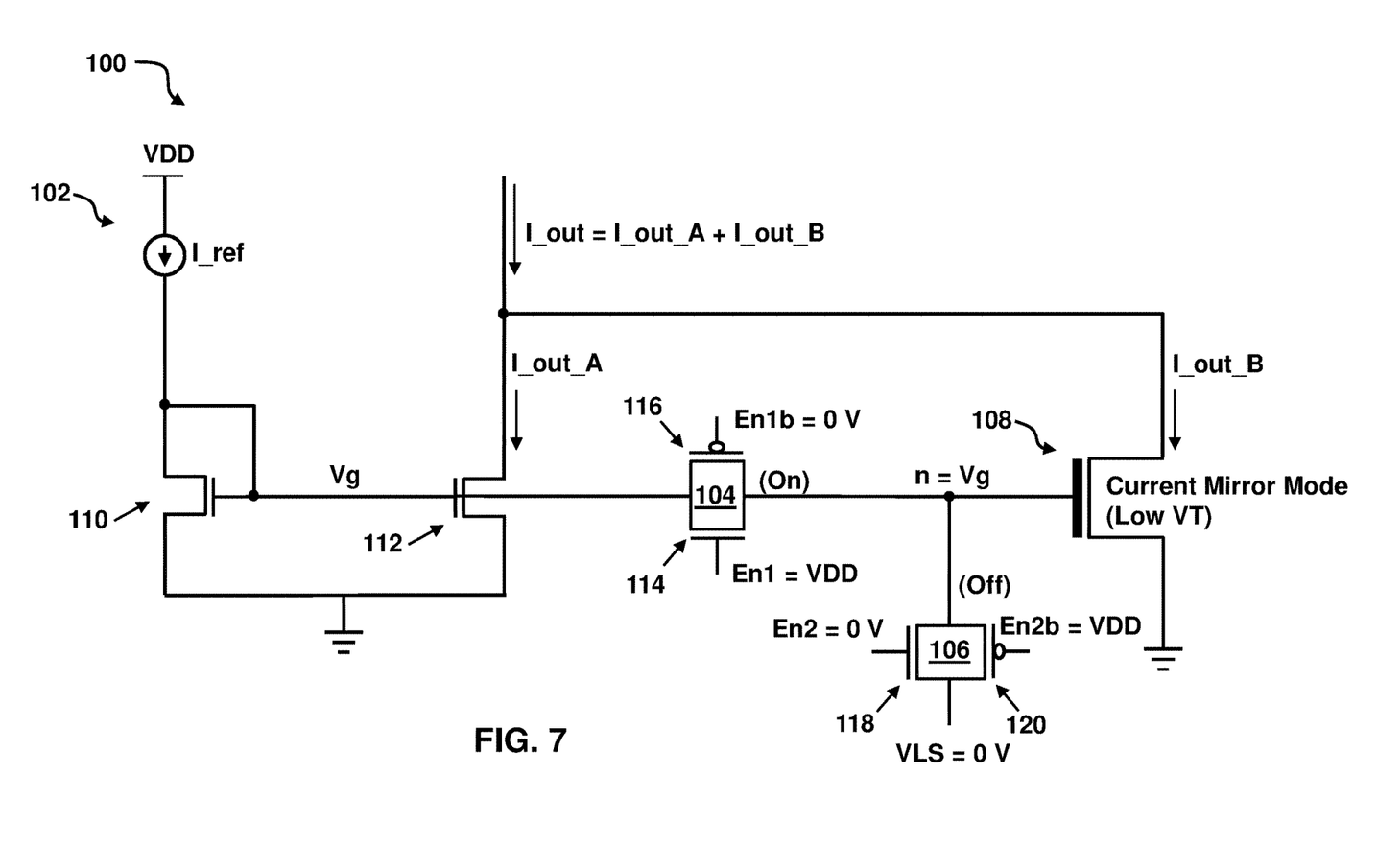
FIG. 7 depicts the current mirror circuit of FIG. 2 with the programmable transistor in a current mirror mode and with a low VT according to embodiments of the disclosure.

The current mirror circuit 100 with the programmable transistor 108 in the current mirror mode is depicted in FIG. 7. In the current mirror mode, assuming the programmable transistor 108 has been programmed to have a low VT, the total current I_out produced by the current mirror circuit 100 is equal to the sum of the current flowing through the output FET 112 of the current mirror 102 (I_out_A) and the current flowing through the programmable transistor 108 (I_out_B).

The programmable transistor 108 may be placed in the current mirror mode by turning on the enable switch 104 and turning off the programming switch 106. The enable switch 104 may be turned on by applying a voltage of En1=VDD to the gate of the NFET 114 and applying a voltage of En1b=0 V to the gate of the PFET 116. As such, the voltage Vg at the input of the enable switch 104 is applied to the gate of the programmable transistor 108. The programming switch 106 may be turned off by applying a voltage En2=0 V to the gate of the NFET 118 and applying a voltage En2b=VDD to the gate of the PFET 120.

With the programmable transistor 108 programmed to have a low VT and with a voltage Vg applied to the gate of the programmable transistor 108, a current (I_out_B) flows through the programmable transistor 108. To this extent, the output current I_out of the current mirror circuit 100 is the sum of the current provided by the current mirror 102

(I_out_A) and the current flowing through the programmable transistor 108 (I_out_B).

Figure 8:
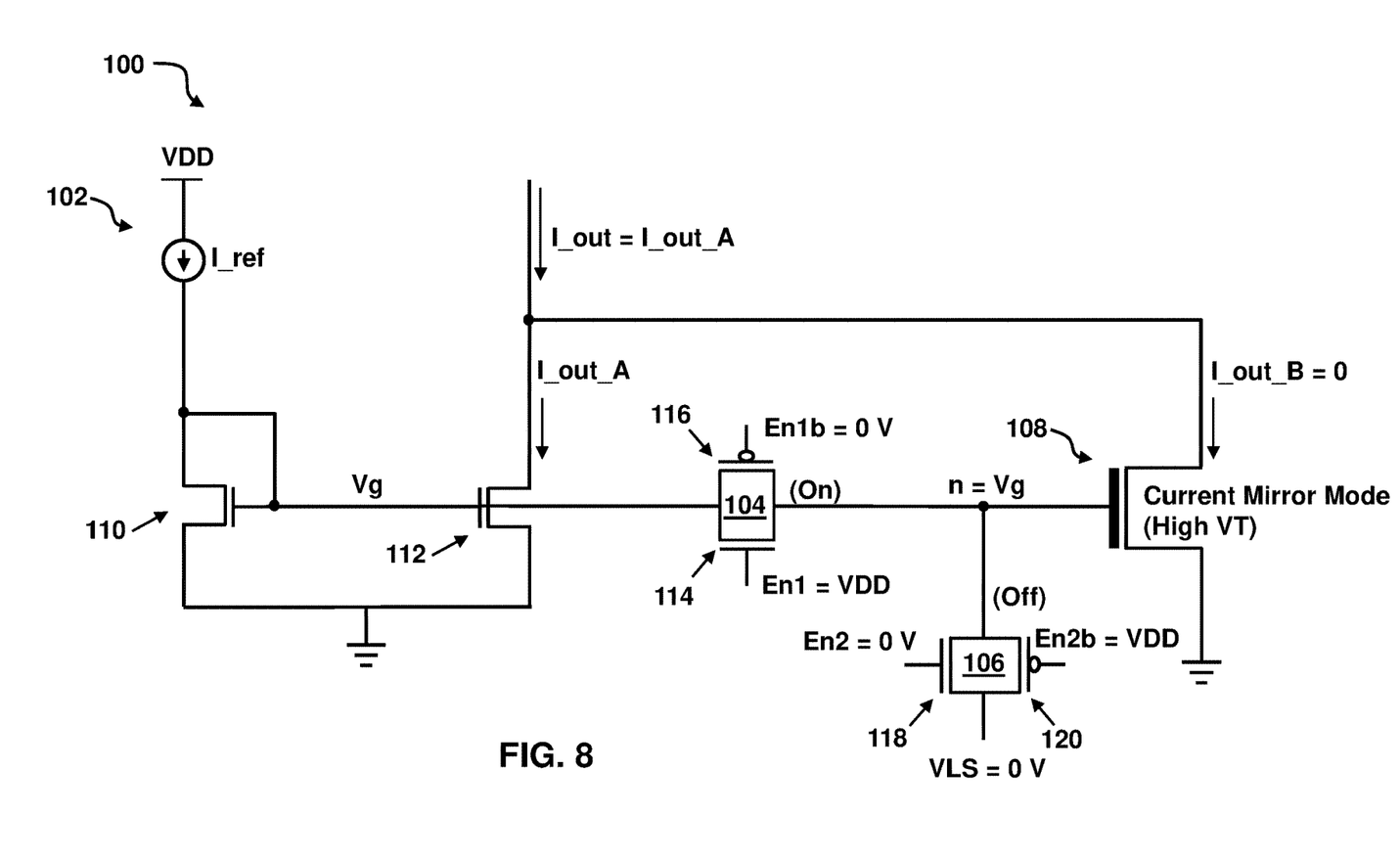
FIG. 8 depicts the current mirror circuit of FIG. 2 with the programmable transistor in a current mirror mode and with a high VT according to embodiments of the disclosure.

The effect of VT on the operation of the current mirror circuit 100 when in the current mirror mode can be appreciated by comparing FIGS. 7 and 8. As detailed above, in the current mirror mode, the enable switch 104 is on (e.g., En1=VDD, En1$b$=0 V) and the programming switch 106 is off (e.g., En2=0 V, En2$b$=VDD). When the programmable transistor 108 is programmed to have a high VT, the programmable transistor 108 is non-conducting (I_out_B=0 V). As such, the total current I_out produced by the current mirror circuit 100 is equal to the current flowing through the output FET 112 of the current mirror 102 (I_out_A).

Figure 9:
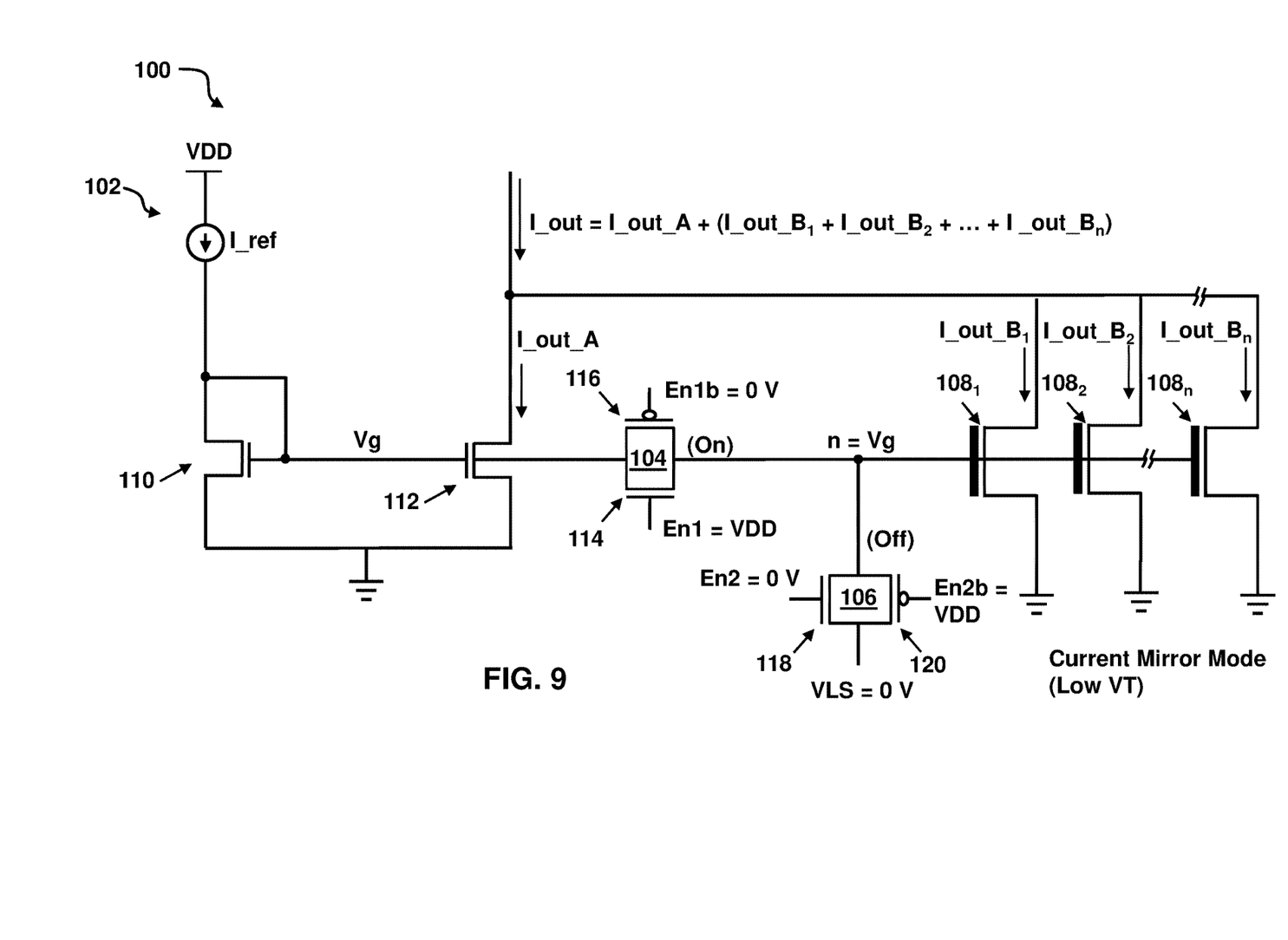
FIG. 9 depicts a current mirror circuit including a plurality of programmable transistors according to embodiments of the disclosure.

According to embodiments of the disclosure, the current mirror circuit 100 may include a plurality of programmable transistors 108 connected in parallel to the current mirror 102. For example, the current mirror circuit 100 depicted in FIG. 9 includes a plurality of programmable transistors $108_1, 108_2, \ldots 108_N$. To this extent, the total output current I_out of the current mirror circuit 100 is equal to the sum of the current flowing through the output FET 112 (I_out_A) and the current flowing through each of the programmable transistors $108_1, 108_2, \ldots 108_N$ (I_out_B$_1$+I_out_B$_2$+ $\ldots$ I_out_B$_N$).

Figure 10:
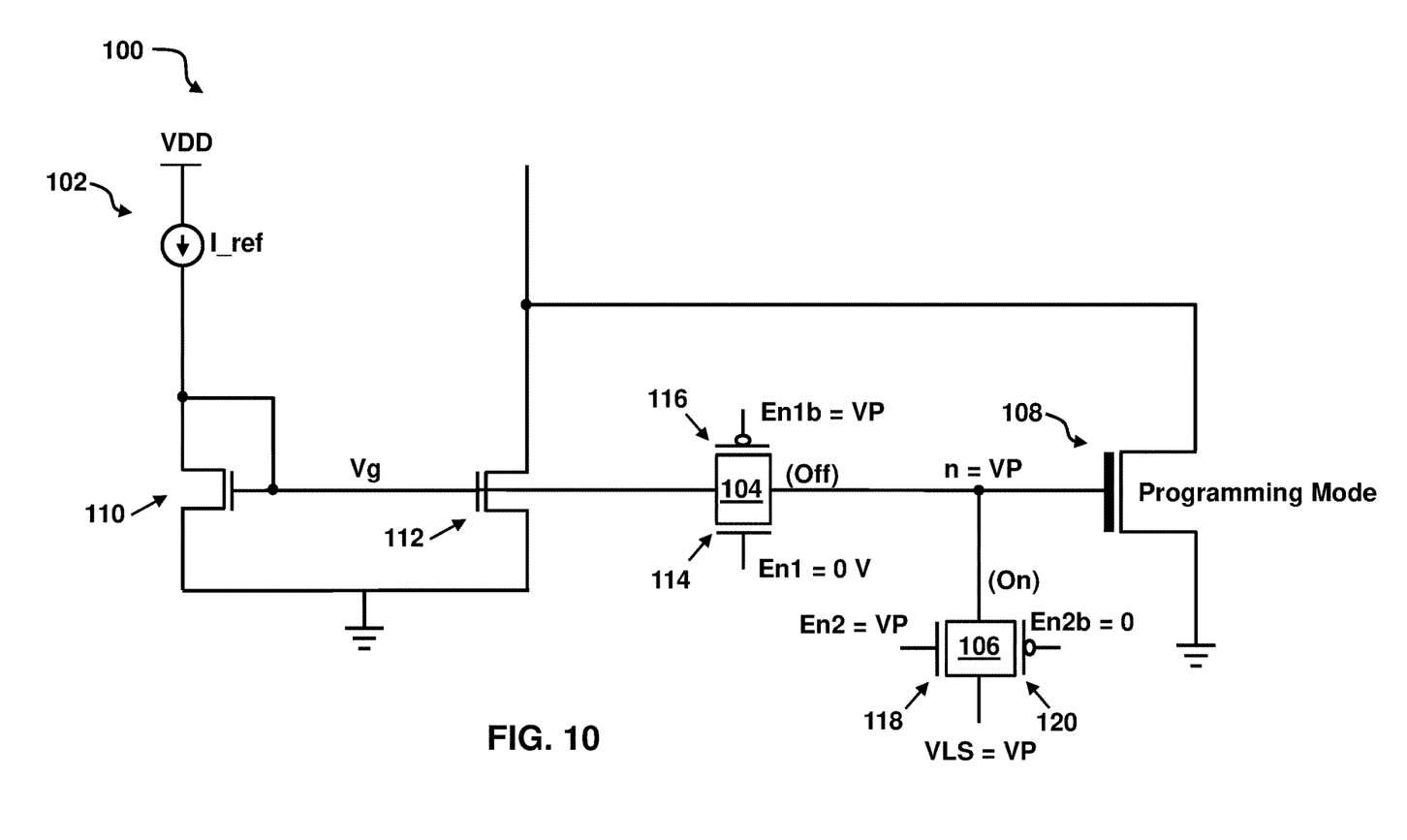
FIG. 10 depicts the current mirror circuit of FIG. 2 with the programmable transistor in a programming mode according to embodiments of the disclosure.

The current mirror circuit 100 with the programmable transistor 108 in the programming mode is depicted in FIG. 10. During programing mode operations, a programming voltage VP applied to the input of the programming switch may be used to program the programmable transistor 108 to have a low VT.

The programmable transistor 108 may be placed in the programming mode by turning off the enable switch 104 and turning on the programming switch 106, while setting the voltage VLS=VP. The enable switch 104 may be turned off by applying a voltage En1=0 V to the gate of the NFET 114 and applying a voltage En1$b$=VP to the gate of the PFET 116. The programming switch 106 may be turned on by applying a voltage En2=VP to the gate of the NFET 118 and applying a voltage En2$b$=0 V to the gate of the PFET 120. To this extent, the voltage at node n and applied to the gate of the programmable transistor 108 is equal to VP.

According to embodiments of the disclosure, VP is variable, which allows the programmable transistor 108 to be programmed to different VTs. In this way, the output current (I_out_B) of the programmable transistor 108 when in the current mirror mode may be adjusted to provide different output currents (I_out_B). That is, the total current I_out of the current mirror circuit 100 (I_out=I_out_A+I_out_B) when in the current mirror mode may be adjusted by varying the VT of the programmable transistor 108 based on the value of VP applied in the programming mode.

Figure 11:
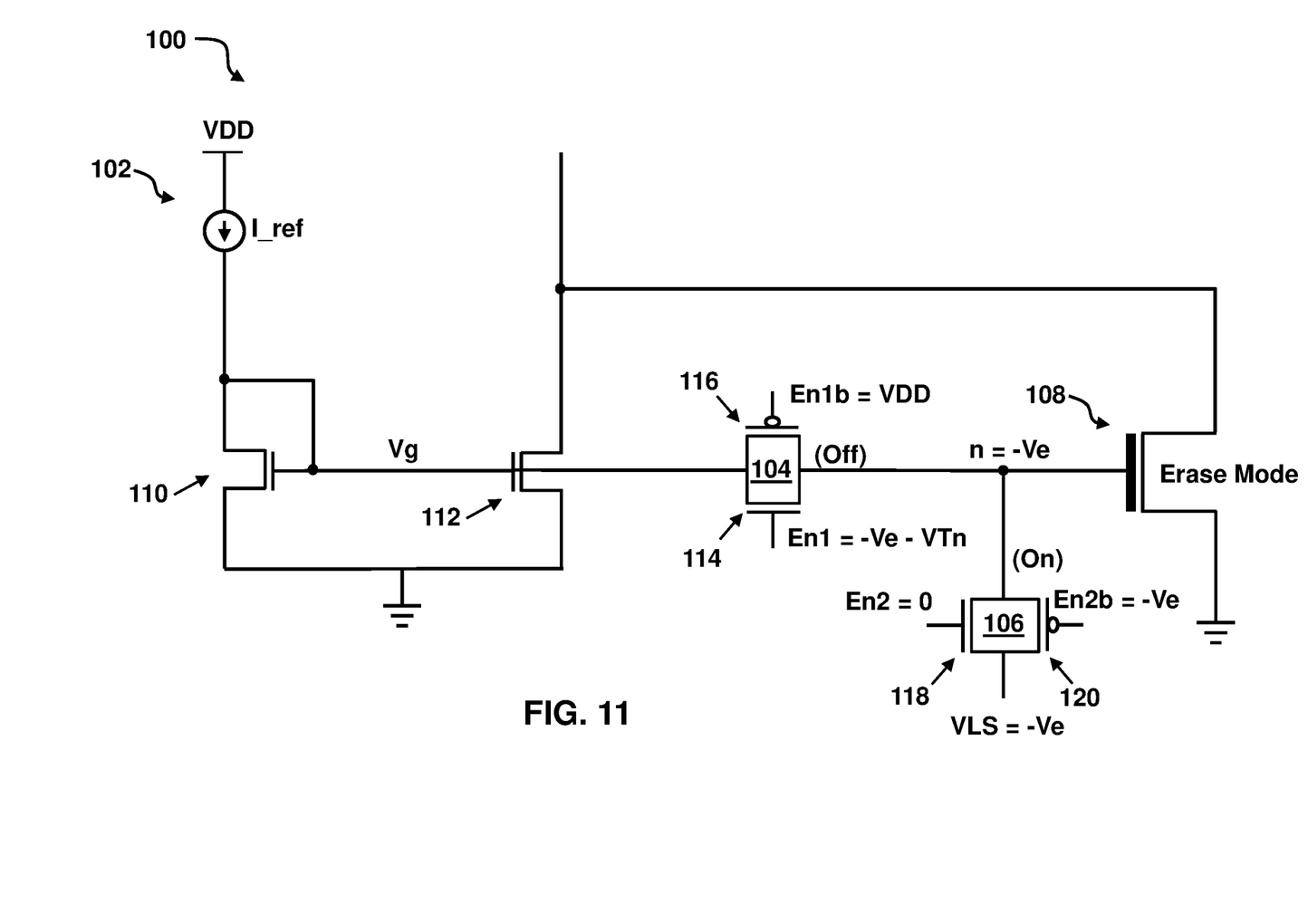
FIG. 11 depicts the current mirror circuit of FIG. 2 with the programmable transistor in an erase mode according to embodiments of the disclosure.

FIG. 11 depicts the current mirror circuit 100 with the programmable transistor 108 in an erase mode according to embodiments of the disclosure. During erase mode operations, the programmable transistor 108 is erased using an erase voltage (-Ve).

The programmable transistor 108 may be placed in the erase mode by turning off the enable switch 104 and turning on the programming switch 106, while setting the voltage VLS at the programmable switch 106 to the erase voltage -Ve. The enable switch 104 may be turned off by applying a voltage En1=VDD to the gate of the PFET 116 and applying a negative voltage to the gate of the NFET 114. For example, the negative voltage applied to the gate of the NFET 114 may be equal to the sum of the erase voltage -Ve and a negative of the threshold voltage VTn of the NFET 114 (e.g., En1=-Ve-VTn). The programming switch 106 may be turned on by applying a voltage of En2=0 V to the gate of the NFET 118 and applying the erase voltage En2$b$=-Ve to the gate of the PFET 120. The voltage at node n and applied to the gate of the programmable transistor 108 is therefore -Ve. This places the programmable transistor 108 in a non-conducting state (high VT, I_out_B=0).

It should be understood that in the structures and method described above, a semiconductor material refers to a material whose conducting properties can be altered by doping with an impurity. Illustrative semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

The method and structure as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a center processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

The invention claimed is:

1. A structure, comprising:
a current mirror;
a programmable transistor with an adjustable threshold voltage connected in parallel with an output transistor of the current mirror;
an enable switch for coupling a gate of the output transistor to a gate of the programmable transistor; and
a programming switch coupled to the gate of the programmable transistor,
wherein the gate of the output transistor of the current mirror is coupled to an input of the enable switch and an output of the enable switch is coupled to the gate of the programmable transistor, and
wherein a drain of the programmable transistor is connected to a drain of the output transistor of the current mirror, and wherein a source of the programmable transistor and a source of the output transistor of the current mirror are coupled to ground.

2. The structure according to claim 1, wherein the programmable transistor comprises any of a ferroelectric field effect transistor and a charge trap field effect transistor.

3. The structure according to claim 1, wherein each of the enable switch and the programming switch comprises an N-type field effect transistor (FET) connected in parallel with a P-type FET.

4. The structure according to claim 1, wherein the adjustable threshold voltage of the programmable transistor is programmable between a first threshold voltage and a second, higher threshold voltage.

5. The structure according to claim 4, wherein the programmable transistor is on when programmed at the first threshold voltage and when a gate voltage on the output transistor of the current mirror is passed to the gate of the programmable transistor by the enable switch, and wherein a total current output by the structure is equal to a sum of an output current of the current mirror and a current flowing though the programmable transistor.

6. The structure according to claim 5, wherein the programmable transistor is off when programmed at the second threshold voltage, and wherein the total current output by the structure is equal to the output current of the current mirror.

7. The structure according to claim 4, wherein, to program the programmable transistor, the enable switch is off and the programming switch is on, and wherein a programming voltage applied to an input of the programming switch is applied to the gate of the programmable transistor.

8. The structure according to claim 7, wherein the programming voltage is adjustable, and wherein the programmable transistor is programmable at a plurality of different first threshold voltages based on the adjustable programming voltage.

9. The structure according to claim 4, wherein, to erase the programmable transistor, the enable switch is off and the programming switch is on, and wherein an erase voltage applied to an input of the programming switch is applied to the gate of the programmable transistor.

10. The structure according to claim 4, wherein, in a current mirror mode, the enable switch is on and the programming switch is off, and wherein a voltage applied to the gate of the output transistor of the current mirror is applied to the gate of the programmable transistor.

11. The structure according to claim 1, further comprising a plurality of the programmable transistors connected in parallel with the current mirror.

12. A current mirror circuit, comprising:
a current mirror;
a programmable transistor with an adjustable threshold voltage connected in parallel with an output transistor of the current mirror, wherein the programmable transistor is operable in any of an off mode, a current mirror mode, a programming mode, and an erase mode;
an enable switch for coupling a gate of the output transistor to a gate of the programmable transistor; and
a programming switch coupled to the gate of the programmable transistor for controlling the adjustable threshold voltage of the programmable transistor,
wherein the gate of the output transistor of the current mirror is coupled to an input of the enable switch and an output of the enable switch is coupled to the gate of the programmable transistor, and wherein a drain of the programmable transistor is connected to a drain of the output transistor of the current mirror, and wherein a source of the programmable transistor and a source of the output transistor of the current mirror are coupled to ground.

13. The current mirror circuit according to claim 12, wherein the programmable transistor comprises any of a ferroelectric field effect transistor and a charge trap field effect transistor.

14. The current mirror circuit according to claim 13, wherein the adjustable threshold voltage of the programmable transistor is programmable between a first threshold voltage and a second, higher threshold voltage.

15. The current mirror circuit according to claim 14, wherein:

the programmable transistor is on when programmed at the first threshold voltage and when in the current mirror mode, wherein a total current output by the current mirror structure is equal to a sum of an output current of the current mirror and a current flowing though the programmable transistor; and the programmable transistor is off when programmed at the second threshold voltage and when in the off mode, wherein the total current output by the current mirror structure is equal to the output current of the current mirror.

16. The current mirror circuit according to claim 14, wherein, to program the programmable transistor in the programming mode, the enable switch is off and the programming switch is on, wherein an adjustable programming voltage applied to an input of the programming switch is applied to the gate of the programmable transistor, and wherein the programmable transistor is programmable at a plurality of different first threshold voltages based on the adjustable programming voltage.

17. The current mirror circuit according to claim 14, wherein, to erase the programmable transistor in the erase mode, the enable switch is off and the programming switch is on, and wherein an erase voltage applied to an input of the programming switch is applied to the gate of the programmable transistor.

\* \* \* \* \*